(12) United States Patent
Carson et al.

(10) Patent No.: US 7,802,021 B2
(45) Date of Patent: Sep. 21, 2010

(54) SYSTEM AND APPARATUS FOR IN-SYSTEM PROGRAMMING

(75) Inventors: Daniel Benjamin Carson, Arlington, WA (US); Hans Frederick Ashlock, Berkeley, CA (US); Sidney Clayton Fluhrer, Pleasant Hill, CA (US); Peter A. Pias, Marysville, WA (US)

(73) Assignee: CheckSum, LLC, Arlington, WA (US)

( * ) Notice: Subject to any disclaimer, the term of this patent is extended or adjusted under 35 U.S.C. 154(b) by 0 days.

(21) Appl. No.: 12/362,267

(22) Filed: Jan. 29, 2009

(65) Prior Publication Data

US 2009/0138841 A1 May 28, 2009

Related U.S. Application Data

(62) Division of application No. 11/347,537, filed on Feb. 2, 2006, now abandoned.

(60) Provisional application No. 60/651,783, filed on Feb. 9, 2005.

(51) Int. Cl.
*G06F 3/00* (2006.01)
(52) U.S. Cl. .......................... 710/8; 702/117
(58) Field of Classification Search .............. 710/8, 710/104; 714/30; 716/17
See application file for complete search history.

(56) References Cited

U.S. PATENT DOCUMENTS

| | | | | |
|---|---|---|---|---|
| 5,329,179 | A * | 7/1994 | Tang et al. | 326/39 |
| 5,590,305 | A | 12/1996 | Terrill | |
| 5,999,014 | A | 12/1999 | Jacobson | |
| 6,049,870 | A | 4/2000 | Greaves | |
| 6,507,213 | B1 * | 1/2003 | Dangat | 326/38 |
| 6,622,272 | B1 * | 9/2003 | Haverkamp et al. | 714/725 |
| 6,874,082 | B2 * | 3/2005 | Tateyama et al. | 713/1 |
| 6,888,371 | B2 | 5/2005 | Wong | |

(Continued)

FOREIGN PATENT DOCUMENTS

EP     0 755 017 A     1/1997

(Continued)

OTHER PUBLICATIONS

"Agilent 3070 In-System Programming (ISP) Family," Agilent Technologies, Inc., Englewood, Colorado, 2002.

(Continued)

*Primary Examiner*—Henry W Tsai
*Assistant Examiner*—Elias Mamo
(74) *Attorney, Agent, or Firm*—Christensen O'Connor Johnson Kindness PLLC

(57) ABSTRACT

Embodiments of the present invention relate to machines that perform in-system programming of programmable devices that are attached to assembled printed circuit boards. In accordance with one aspect, multiple nonvolatile devices may be programmed in a single session at their normal maximum programming speeds. Different nonvolatile devices on a board can receive different data. Data variables can be inserted so that not all boards receive identical data. A master controller sends image files and algorithm information to a subsidiary controller. The subsidiary controller executes a device algorithm, and an FPGA executes a bus algorithm. Embodiments of the present invention can be designed as stand-alone systems or to operate cooperatively with an automatic tester, so that testing and device programming can take place in a single operation using a single fixture to hold the circuit board.

9 Claims, 6 Drawing Sheets

U.S. PATENT DOCUMENTS

| | | | |
|---|---|---|---|
| 6,918,027 B2 | 7/2005 | Mantey | |
| 6,983,441 B2 * | 1/2006 | Wescott | 716/17 |
| 7,023,239 B1 * | 4/2006 | Jacobson et al. | 326/38 |
| 7,032,045 B2 * | 4/2006 | Kostadinov | 710/105 |
| 7,127,708 B2 | 10/2006 | Gomez | |
| 2003/0023793 A1 * | 1/2003 | Mantey et al. | 710/100 |
| 2003/0098710 A1 | 5/2003 | Wong | |
| 2004/0001432 A1 | 1/2004 | Wescott | |

FOREIGN PATENT DOCUMENTS

| | | |
|---|---|---|
| EP | 0 802 494 A | 10/1997 |

OTHER PUBLICATIONS

"Onboard Programming Solutions," GenRad, Inc., Westford, Massachusetts, 2001.

Raymond, Douglas W., et al., "Non-Volatile Programmable Devices and In Circuit Test," Paper 33.3, Proceedings of the IEEE International Test Conference 1994, pp. 817-823.

* cited by examiner

Visual MDA – ISPMw Buffer Wiring

| MPX Connection | | | UUT Connection | | |
|---|---|---|---|---|---|
| Buffer Number/Pin | Fixture I/F | ICT Point Number | Point Name | Buffer Number/Pin | Buffer Pin Name |
| #1/J2-2 | A-11 | 11 | SCK | #1/J3-2 | CLK |
| #1/J2-4 | A-4 | 4 | EE_CS* | #1/J3-4 | MODE |
| #1/J2-6 | A-5 | 5 | SDI | #1/J3-6 | MOSI |
| #1/J2-8 | A-12 | 12 | SDO | #1/J3-8 | MISO |
| #1/J2-10 | A-7 | 7 | GND | #1/J3-10 | GND |
| #1/J2-12 | A-6 | 6 | +5V | #1/J3-12 | PWR |
| #2/J2-2 | A-25 | 25 | SCK#2 | #2/J3-2 | CLK |
| #2/J2-4 | A-18 | 18 | EE_CS*#2 | #2/J3-4 | MODE |

Modify... | Check MPX Wires | Probe UUT Point | Self-Test | Check Table
? Help | ✓ OK

510

511

513

*Fig. 5B.*

SYSTEM AND APPARATUS FOR IN-SYSTEM PROGRAMMING

CROSS-REFERENCE TO RELATED APPLICATION

This application is a divisional of application Ser. No. 11/347,537, filed Feb. 2, 2006, which claims the benefit of Provisional Application No. 60/651,783, filed Feb. 9, 2005, which are incorporated herein by reference.

FIELD OF THE INVENTION

In general, the present invention relates to in-system programming of programmable devices and, in particular, to a system and apparatus for in-system programming of programmable devices at full hardware speed.

BACKGROUND

"Programmable devices" are integrated circuits that contain nonvolatile memory ("NVM"). There are many kinds in use today, and it is certain that more new kinds will be introduced in the future. Nonvolatile memory is used for many purposes and occurs in many forms in many different kinds of programmable devices. For example, programmable devices include, but are not limited to:

1. "PROM" (Programmable Read-Only Memory) is an example of a programmable nonvolatile device.
2. "PAL" and "GAL" (Programmable Array Logic and Generic Array Logic) have similarly been used for many years to implement simple logic functions and to create replacements for ICs that have become obsolete.
3. "EEPROM" (Electrically Erasable PROM). These types of NVM are most often used for bootstrap loading microprocessors.
4. "Flash memory" and its many relatives are generally used to store instruction codes for microprocessors. Due to their relatively fast programming times, they are also used in many consumer storage applications.
5. Many microcontrollers contain embedded nonvolatile memories, often including both FLASH and EEPROM memories.
6. The "FPGA" (Field-Programmable Gate Array) contains memory cells that control switches and the switches, in turn, establish the logic networks that define the functions of the FPGA. FPGAs occur in endless variety and many kinds of FPGAs are nonvolatile.

Some FPGAs are built internally using volatile memory cells rather than nonvolatile cells. In most applications of volatile FPGAs, an associated nonvolatile memory IC supplies the bits that are loaded into the FPGA's switches. In other applications of volatile FPGAs, the loading of bits is managed by a processor. The local processor may have additional duties to perform other than programming the FPGA. Indeed, the FPGA hardware may be used in more than one way during the course of executing various jobs. For example, after a FPGA has served one purpose, the processor can reload it and use it for a different purpose.

The use of nonvolatile memory is not strictly limited to digital ICs. There are "analog" ICs that use nonvolatile memory, for example, to hold potentiometer adjustment settings, to provide lookup tables for analog functions, and to hold trim settings for high-precision devices. "Digital" flash memories that hold more than one bit per cell can also be regarded as having an analog basis.

"Programmable" integrated circuits are distinct from and different than "nonprogrammable" integrated circuits. In particular, "nonprogrammable" integrated circuits are circuits whose configuration is fixed at the time they are manufactured. For example, a great number of "standard" ICs are made from fixed mask sets. These can be purchased from catalogs containing published specifications. "Custom" or "semicustom" ICs are also nonprogrammable. A custom IC is one that is built for a specific purpose for a specific customer. Making a custom IC generally involves making a custom mask that establishes memory contents or logic network at the time the wafer is processed. Such a mask is customer-specified, but is nonetheless fixed. There are masked read-only memories and masked gate arrays, for example, which can be customized by the circuit designer but cannot be altered once they are packaged.

In contrast, programmable integrated circuits may be programmed after they are manufactured. This feature of programmable devices offers many advantages over nonprogrammable devices from the perspective of the people who design and manufacture circuit boards. One advantage is that a read-only memory's contents need not be finalized until late in the manufacturing process, which reduces lead time by making it possible to start board manufacturing before logic designs are fully completed. Another advantage is that a programmable IC makes it possible to introduce engineering changes quickly, while products are in production. Additionally, programmable ICs allow circuit boards to implement wholly different functionality while remaining identical to one another with respect to procurement and inventory logistics which reduces hardware cost and manufacturing overhead.

Programmable devices, to be useful, require a mechanism for programming them. Conventionally, such a device is called a "prom programmer." The prom programmer executes algorithms that cause the programming information to be written into the memories in the devices. Raw, unprogrammed devices are brought from stock, programmed, labeled, and either returned to stock or taken to the place where they will be installed into circuit boards. The programming protocols, also referred to herein as device algorithms, that are specified by the IC manufacturers may involve high voltages and may involve reading data back out of the device to see when the programming or erasing operation has succeeded.

"ISP" (In-System Programming) is defined as the act of "programming a component after it has been permanently installed on a circuit board." ICs can be specifically designed for ISP. A chip may be generally regarded as an ISP chip if the IC programming protocol involves no damaging voltages and if its programming protocol can be executed successfully in the presence of other components. In addition, circuit boards can be designed to allow the in-system programming of ICs that were not originally designed as ISP devices. A given device may be ISP or not ISP based on its original design and on the constraints imposed on it by surrounding components on the board to which it is attached.

Most ISP chips use bus protocols that are standard in the electronics industry, such as "I²C" (Inter-IC Communications), "SPI" (Serial Peripheral Interface), "MicroWire," "JTAG" (Joint Test Action Group), and so forth. The four protocols mentioned above are well known and widely used standards and are known to persons of ordinary skill in the art of electronic design. Other ISPs may use custom designed bus protocols.

The advantages of ISP over conventional programmability are considerable. A conventional programmable chip needs to be handled twice, once for programming the chip and a second time for installing the chip on its circuit board.

ISP greatly simplifies material logistics as well since the programmed parts need not be renumbered, labeled, counted, or depreciated. When the design changes, the stock does not have to be purged and updated.

If ISP activities are combined with automatic testing, further advantages accrue. Loading code into programmable ICs adds value to the board, as the board coming out of test is not identical to the board going in. The test equipment can therefore be seen as a value-added process step in contrast to conventional testing wherein the board under test is tested, but not programmed. The success or failure of the programming operation can be counted as an additional quality assurance test as well. Finally, the testing station is already a required part of the assembly operation. If the testing station carries out the programming and the programming time is not excessive, an additional programming station is not required.

People who set up assembly lines for manufacturing printed circuit assemblies have a lot of different kinds of automatic test equipment from which to choose. For the least amount of money, an "MDA" (Manufacturing Defect Analyzer) or low end "ICT" (In-Circuit Tester) capable of detecting solder shorts, making analog measurements, and checking connectivity pin faults on integrated circuits may be obtained. For larger dollar values, complex combinational testers capable of conducting digital function tests and making parametric measurements with board power applied may be obtained. A vast price disparity exists from one end of the "ATE" (Automatic Test Equipment) market spectrum to the other. A so-called "high end" automatic tester may cost 50 times as much as an MDA. Regardless of the price of the machine, the ISP facilities currently available are minimal and are generally not capable of operating at a speed necessary for programming as part of the assembly line.

ISP is a rapidly growing segment in the programmable-IC market, estimated to be doubling annually. The ISP advantages have been known for some time, but growth in their use, particularly the combination of ISP with test equipment such as an MDA or ICT, has not matched the growth of the ISP integrated circuit market as a whole. The slow growth of ISP and ISP with testing is the result of the drawbacks existing in current systems. For example, the time taken to perform programming with today's test equipment is not acceptable. Additionally, current test equipment is not capable of managing and/or implementing ISP routines necessary to fully test an ISP device. Still further, existing ISP equipment does not provide the ability to program multiple ISP devices of various types, each potentially requiring a different bus protocol simultaneously.

Accordingly, there is a need for a system and apparatus that resolves the drawbacks that exist with typical ISP equipment. Additionally, a system and apparatus that resolves these problems that may be utilized in conjunction with any existing Automatic Test Equipment, including high-end in-circuit tester, low-end manufacturing defect analyzer, or any type of equipment there between, is desirable.

SUMMARY

According to one aspect of the present invention, a system for the concurrent programming of a plurality of ISP devices installed on one or more circuit boards is provided. The system may include a host computer with an external bus interface and at least one communication interface located proximally to at least one ISP device on at least one circuit board. The communication interface(s) may be positioned close to the ISP device(s). Additionally, the system may include a subsidiary processing circuit located proximally to a circuit board containing an ISP device and under control of the host computer. The subsidiary processing circuit may include a bus interface for communication with the host computer, a local processor arranged to receive programs of instructions from the host computer and to store them in its local memory, a local volatile FPGA arranged to receive its program under control of the host computer and local processor, and a wired interface to the communication interface(s). The communication interface(s) and the subsidiary processing circuit may be implemented on separate devices or integrated onto a single device. Additionally, the communication interface and/or the subsidiary processing circuit may be integrated into the host computer.

Still further, an application software development system for preparing at least one file containing a program of instructions executable by the host computer is provided. The system may also be used to prepare at least one file containing a program of instructions executable by the local processor of the subsidiary processing circuit for programming an ISP device (otherwise referred to as a device algorithm), and at least one file representing an FPGA program to configure a FPGA for generating ISP serial bus transactions (otherwise referred to as a bus algorithm). Additionally, the system may be used to prepare at least one file representing an array of digital information to be stored in an ISP device installed on a circuit board.

The system may also include a runtime software system comprising software elements for transferring information to the subsidiary processing circuit for the purpose of producing signals on its wired interface to a communication interface. The signals may be used to affect the loading of programming information into an ISP chip or into ISP chips installed on the circuit board or circuit boards.

In the system generally described above, one subsidiary processing circuit may program several ISP devices of the same type concurrently via a plurality of communication interfaces. For example, the total time taken to program all of the ISP devices may be the time taken to program the ISP device that takes the longest. Additionally, the subsidiary processing circuit may be implemented on the same device as one or more of the plurality of communication interfaces. Likewise, the communication interfaces may be implemented on one or more devices.

Still further, the host computer may also host an automatic tester and the circuit board may be held in a test fixture that contains contact pins contacting electrical nodes of the circuit board. The subsidiary processing circuit and at least one communication interface may also be mounted in the test fixture and electrical connections between the communication interface and electrical nodes of the circuit board may be effected by contact pins in the fixture.

The host computer may also contain a software operating system that controls the automatic tester and that contains a sequence of instructions, which causes the host computer's operating system to launch a second program of instructions. The second program may be used to effect an ISP application for programming ISP devices installed on the circuit board that is held in the test fixture. Additionally, the second program of instructions may contain a sequence of instructions that causes the host computer's operating system to return control to the software system of the automatic tester.

In accordance with another aspect of the present invention, an application development system for developing applications for the concurrent programming of multiple ISP devices, including a visual user interface containing selector objects, is provided. The system may include a selector object that selects an ISP device type from a library of device types, identifies a data file representing fields of digital information to be programmed into an ISP device, and identifies a word width for ISP devices having more than one word width. The output of the application development process may include at least one file containing a program of instructions executable by the host computer, at least one file containing a program of instructions for a subsidiary processor outside the host computer, and at least one file containing fields of digital information for programming an FPGA to generate an ISP programming protocol.

The output of the application development process may include at least one configuration file representing the configuration of the application. For example, the configuration files may include a path name to a file containing information representing an ISP device algorithm, a path name to a file containing information representing an ISP bus algorithm, an information field describing the location and structure of data files containing data to be programmed into the ISP devices, an information field describing devices and ports used for communicating with a subsidiary processing circuit and with elements of said subsidiary processing circuit, and an information field describing the number of ISP devices to be concurrently programmed, the type of those ISP devices, the amount of information to be programmed into each device, and the disposition of error information.

In such an application development system, the file containing a program of instructions executable by said host computer may be based on a Dynamic Link Library ("DLL") and the DLL may provide an Application Program Interface ("API"). The API may provide routines including, but not limited to, the method of erasing an ISP device prior to programming it, verifying erasure of an ISP device, programming an ISP device, verifying the ISP after programming it, and returning the ISP device status after an ISP operation.

In accordance with another aspect of the present invention, a system for the programming of ISP devices attached to circuit boards in which processing of information is carried out at three processing levels is provided. At a first processing level is a host computer programmed to load digital information into a subsidiary processor. At a second processing level is a subsidiary processor programmed to execute a device algorithm. Finally, at a third processing level is an FPGA programmed to execute a bus algorithm. Additionally, the device algorithm may be selected from a library of device algorithms and the bus algorithm may be selected from a library of bus algorithms.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIGS. 5A and 5B are pictorial diagrams of a data entry form provided as part of an application development visual environment, in accordance with an embodiment of the present invention.

DETAILED DESCRIPTION

Figure 1:
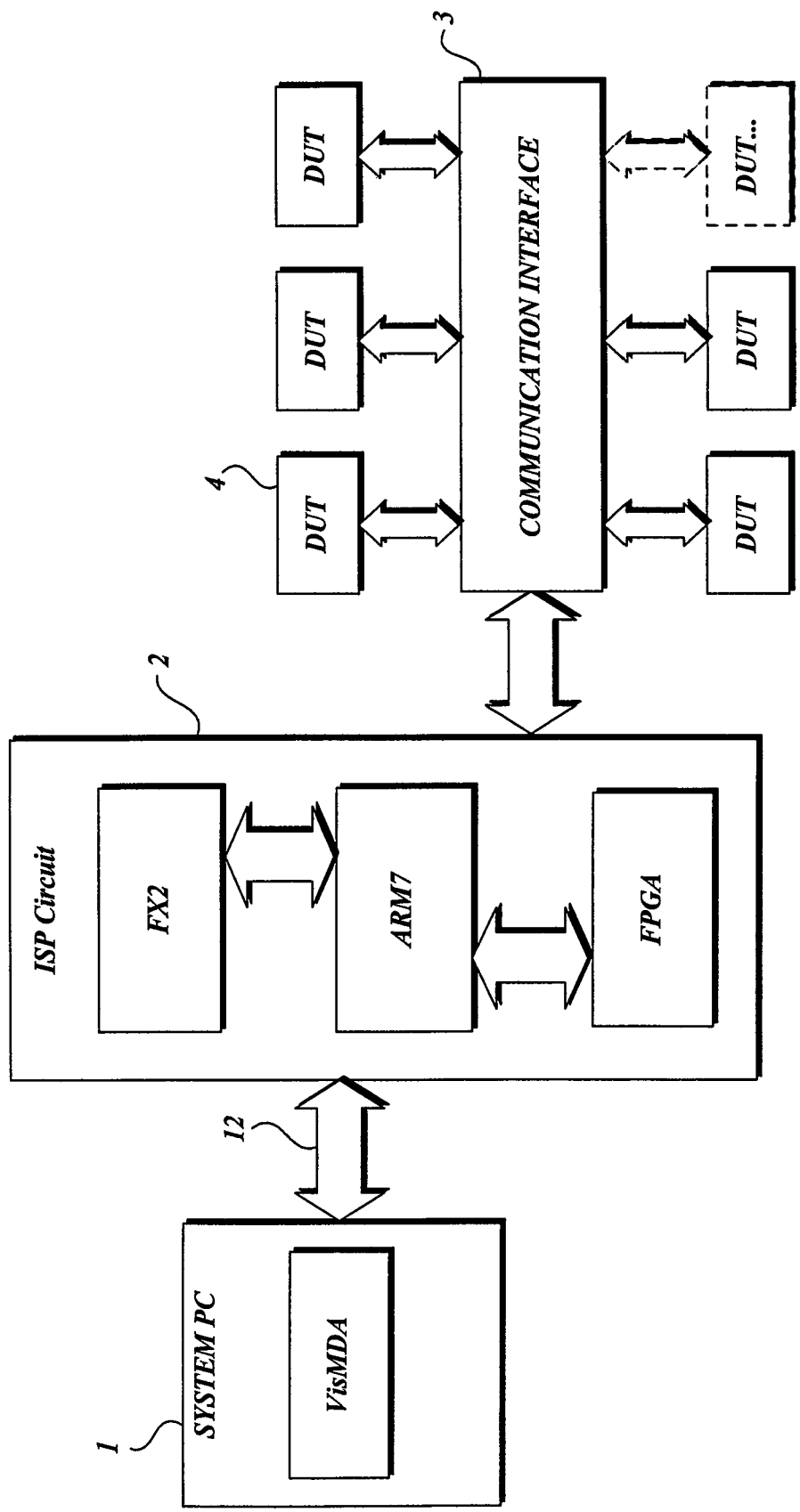
FIG. 1 is a block diagram of a system for in-system programming of programmable devices, in accordance with an embodiment of the present invention.

For purposes of this discussion, embodiments of the present invention will be described as operating in association with an automatic test machine. However, embodiments of the present invention are not limited to such a configuration and may be configured to be fully capable of operating independent of an automatic test machine. Accordingly, embodiments of the present invention may be designed for operating with or without the use of an automatic test machine without departing from the spirit and scope of the invention.

As noted above, today's ATE market has not fully come to grips with the need to program ISP chips during production. There are several identifiable obstacles to easy use of ISP. The obstacles include, but are not limited to:

1. Typical accessories specifically designed to work as accessories to ATE machines do not provide the ease of use that prom programmers provide. ATE application development systems are primarily devoted to the complexities of testing boards. The accessory is designed as an integral part of the ATE. It features an ATE-like application development system, which is to say, it has complexities not usually found in the application system of a conventional prom programmer;
2. Prom programmers are oriented to socketed ICs, do not take advantage of ISP capabilities, and are designed to stand alone, dealing with isolated chips;
3. If a board contains multiple ISP devices, as in a board containing several copies of a simpler board, multiple prom programmers must be integrated, at great expense. Multiple prom programmers integrated together may interfere with each other. The multiple-programmers problem is especially acute if there are ISP devices of different types on the board;
4. The ISP workpiece has a high value as a piece of semi-finished goods compared to the value of its parts prior to assembly. In addition, the semi-finished workpiece occupies a place in a production line representing high capital investment. In high volume assembly operations, the cycle time per assembled board or "takt time" is responsible for a large part of the cost of assembling the circuit board. Speed of programming is therefore far more important in an ISP situation than in a conventional situation where chips have not yet been assembled into an expensive circuit board and a more leisurely off-line programming pace can be tolerated; and
5. Accessories designed for ISP programming tend to be too bulky to include in an ATE test fixture, especially if multiples are required. The effect of the bulk is more than cosmetic, as it forces the programming apparatus to be distant from the ISP devices, the parasitic effects of having long wires between the device and the accessory can have a deleterious effect on the performance of the application as a whole.

For all these reasons, therefore, ISP has not yet fully realized its promise. Embodiments of the present invention, as described below, resolve some, if not all, of these obstacles and thereby provide significant cost advantages to users of ISP.

Typically, native ATE hardware and software is designed first for testing and second (if at all) for programming ISP. At the low end, ATE machines tend to be analog-only and have no facilities for handling digital information of any kind. In general, most of their work is performed without applying power to the board under test, ruling out ISP work entirely.

At the high end, typical ATE machines are designed with a digital focus and apply power to the board under test. They still do not address the needs of ISP well. Indeed, ISP accessories are available for most digital-capable ATE, as discussed in (1) Raymond, Douglas W., et al., "Non-Volatile Programmable Devices and In-Circuit Test," Paper 33.3, *International Test Conference* 1994, IEEE 0-7803-2102-2/94; (2) (author not disclosed), "Agilent 3070 In-System Programming (ISP) Family" Agilent, Inc., 5988-4043EN and (3) (author not disclosed), "Onboard Programming Solutions," Genrad, Inc., GR222-07/2001. However, such systems tend to be constrained in ways that increase their cost or limit their throughput to the point of unusability in high volume production.

For example, a digital tester may rely on the tester's native digital stimulus and response system, typically memory-backed channel circuits. Massive amounts of expensive high-speed memory may need to be added to handle the number of patterns or else the tester will take time to repeatedly reload its testhead memory, slowing the operations to a crawl. It is certain that the amount of memory contained in ISP devices will increase over time, so no amount of memory added to an ATE's test head will ever be enough to handle all anticipated future needs.

Makers of digital ATE therefore provide specialized accessories and handle ISP programming as an afterthought, as in Raymond, Douglas W., et al., "Non-volatile Programmable Devices and In-Circuit Test," Paper 33.3, *International Test Conference* 1994, IEEE 0-7803-2102-2/94. The ISP accessories available with some digital ATE also interact with only one IC at a time. As a result, the processing time is the sum of the processing time for all the ISP chips on the board under test and the throughput is unacceptably slow. The tester must, after all, keep up with the assembly equipment or be taken out of the production line.

Application Development for an ISP system built on ATE principles is also a significant chore. An ATE software system tends to be optimized for letting the user manipulate single bits but not for processing large data files that are organized as words or bytes. Converting the data files into languages made for the ATE can lead to unacceptably long setup and debug periods. It can also adversely affect the handling of changes in data files.

In contrast to existing ATE and prom programmers, one aspect of the present invention is to serve as a fully capable, ISP-oriented, universal prom type programmers that can stand alone or be economically integrated into high-end or low-end ATE. Additionally, embodiments of the present invention are designed to minimize the amount of setup work and may be particularly structured to facilitate the handling of multiple devices. Still further, embodiments of the present invention may be configured to handle data files without having to translate those files into an ATE language.

Additional advantages and capabilities may also be realized with embodiments of the present invention that were not provided in any previous ISP programming system, including, but not limited to:

1. The ability to program any type of ISP device (e.g., serial devices, parallel flash devices, microprocessors, etc.), including those not yet conceived. New bus protocols and new algorithms can be added by simply adding software;
2. The ability to program multiple different devices and or multiple boards containing multiple different devices in a single operation;
3. The ability to pass common data to each ISP device in the group concurrently;
4. The ability to pass device specific data, for example, serial number, date code, or parameters, such as calibration codes, that are computed from measurements taken immediately prior to programming;
5. The ability to exclude from programming any device that has failed a previous electrical test;
6. The ability to provide one common visual interface to the application developer for all types of ISP devices;
7. The hardware can be combined with an ATE in a common test fixture;
8. The software can be launched from a foreign software system, such as an ATE software system; and
9. If embodiments of the invention are used in combination with an ATE test fixture, the board under test need not be equipped with a programming connector which saves cost, board area, and weight in the final product.

FIG. 1 is a block diagram of an overall ISP test system, configured in accordance with an embodiment of the present invention. The System Personal Computer ("System PC") 1 controls an ISP circuit 2 (also referred to herein as a subsidiary processing circuit) over an interface 12. In an embodiment of the present invention the interface is a Universal Serial Bus 2.0 ("USB") 12. However, any type of communication interface may be used with embodiments of the present invention. For example, a parallel interface, firewire, wireless, infrared, or any other type of interface may be used. In an alternative embodiment, the ISP circuit 2 (subsidiary processing circuit) may be integrated into the System PC, thereby eliminating the need for the interface.

Figure 2:
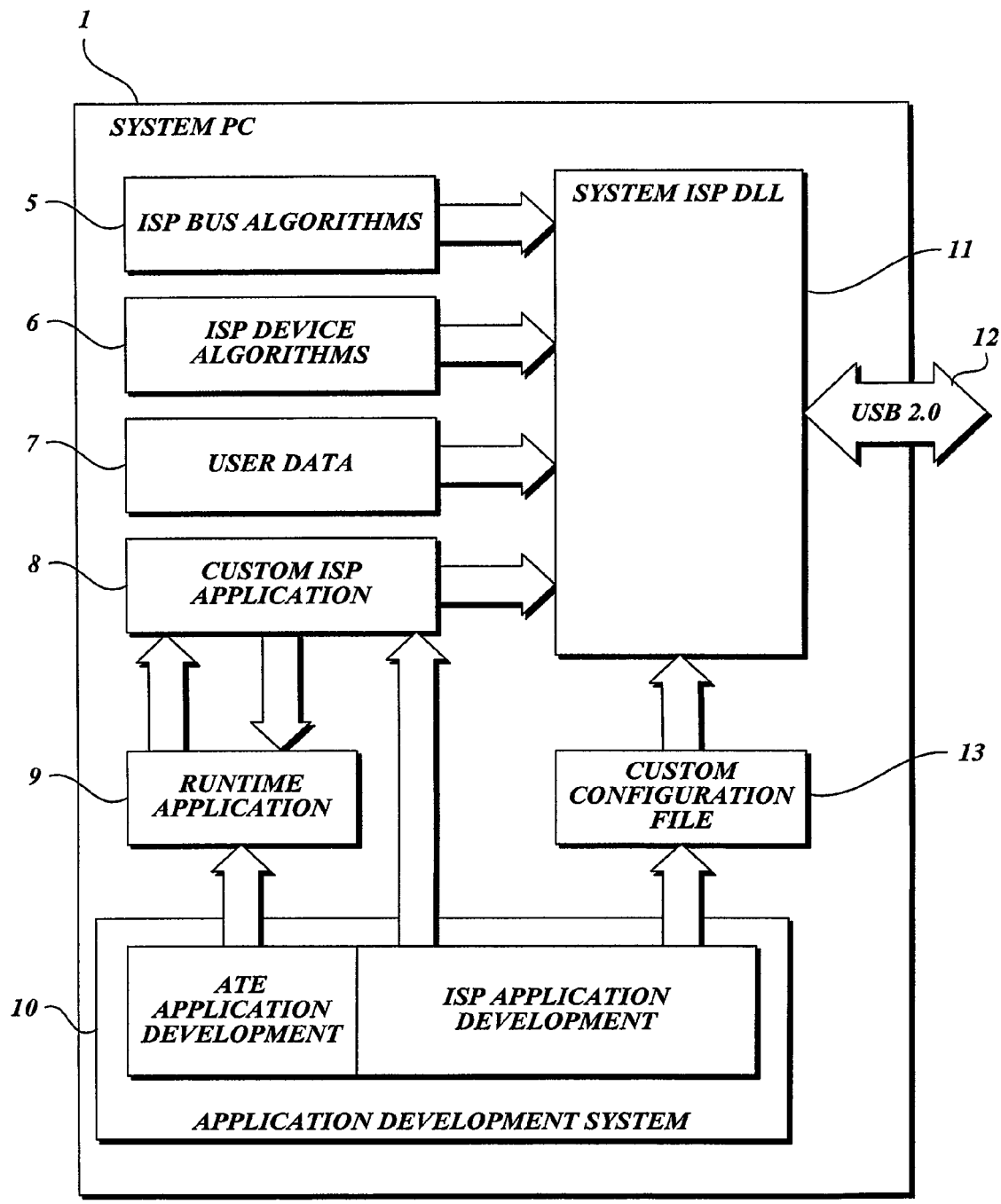
FIG. 2 is a block diagram of a detail view of a System PC, configured in accordance with an embodiment of the present invention.

FIG. 2 is a more detailed view of the System PC 1, configured in accordance with an embodiment of the present invention. The System PC 1 provides an operating environment for the runtime application 9 and a custom ISP application 8, two software modules that pass control back and forth.

There are two main phases in the operation of embodiments of the present invention, erase operations and verification operations. Status operations may also be performed as part of the Runtime ISP programming. These and other operations may be included in the ISP programming phase. As a whole, embodiments of the present invention are designed to handle one or both phases.

Figure 5A:
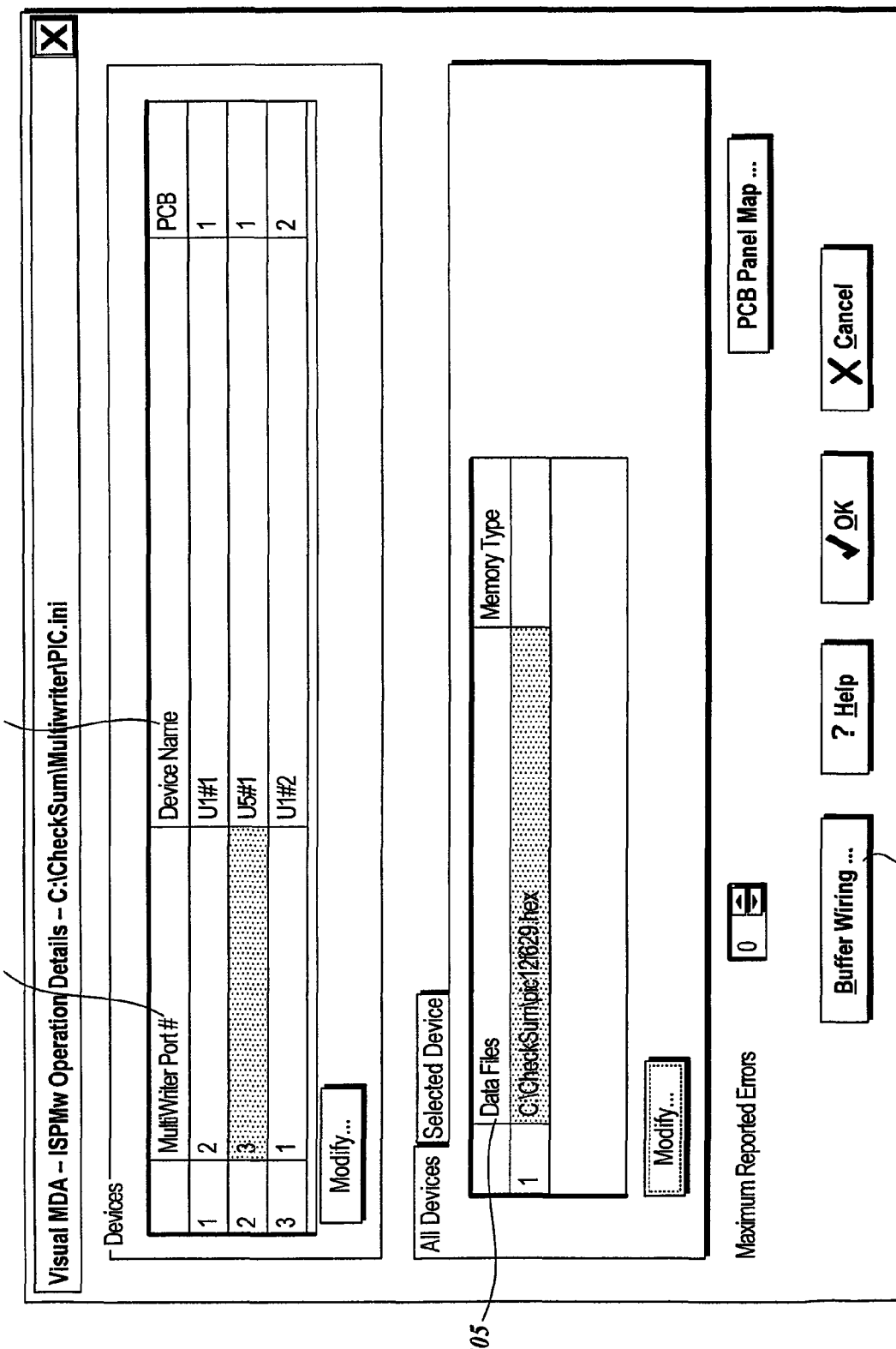

During application development 10, a user provides information that describes the ISP chips, their wiring connections, and the data files that each ISP chip will receive. In particular, an application development visual environment (FIGS. 5A and 5B) provides a data entry form 500 in which the developer specifies the type of device to be programmed 501, the location of the device 503, the file name of the data file holding data to be written into the device 505, and other customer-specific device configuration items. Other customer-specific device configuration items may include mode, speed, calibration data, device size, data alignment, and block size. For each device, selection of a buffer wiring button 507 provides a wiring arrangement window 510. The wiring arrangement window identifies the specific connections between the devices bus in the communication interface 3 (FIG. 1).

In addition to being able to provide the arrangement, the wiring arrangement may be checked to confirm the accuracy of the physical wiring prior to programming. In one embodiment, selection of a Check Wiring button 511 will result in each wiring connection being confirmed according to the wiring arrangement provided in the wiring arrangement window 510. Still further, a user may probe each individual wiring connection, using a wiring probe (not shown) and be provided with an identification of the appropriate wiring connection, as shown in the wiring arrangement window 510. In one embodiment, a user may select a Probe UUT button 513 to activate the probe application and then physically touch a wiring connection with a wiring probe. In response to a wiring connection being touched with a probe, the corresponding wiring connection, as identified in the wiring arrangement window, will be emphasized (e.g., highlighted).

Figure 3:
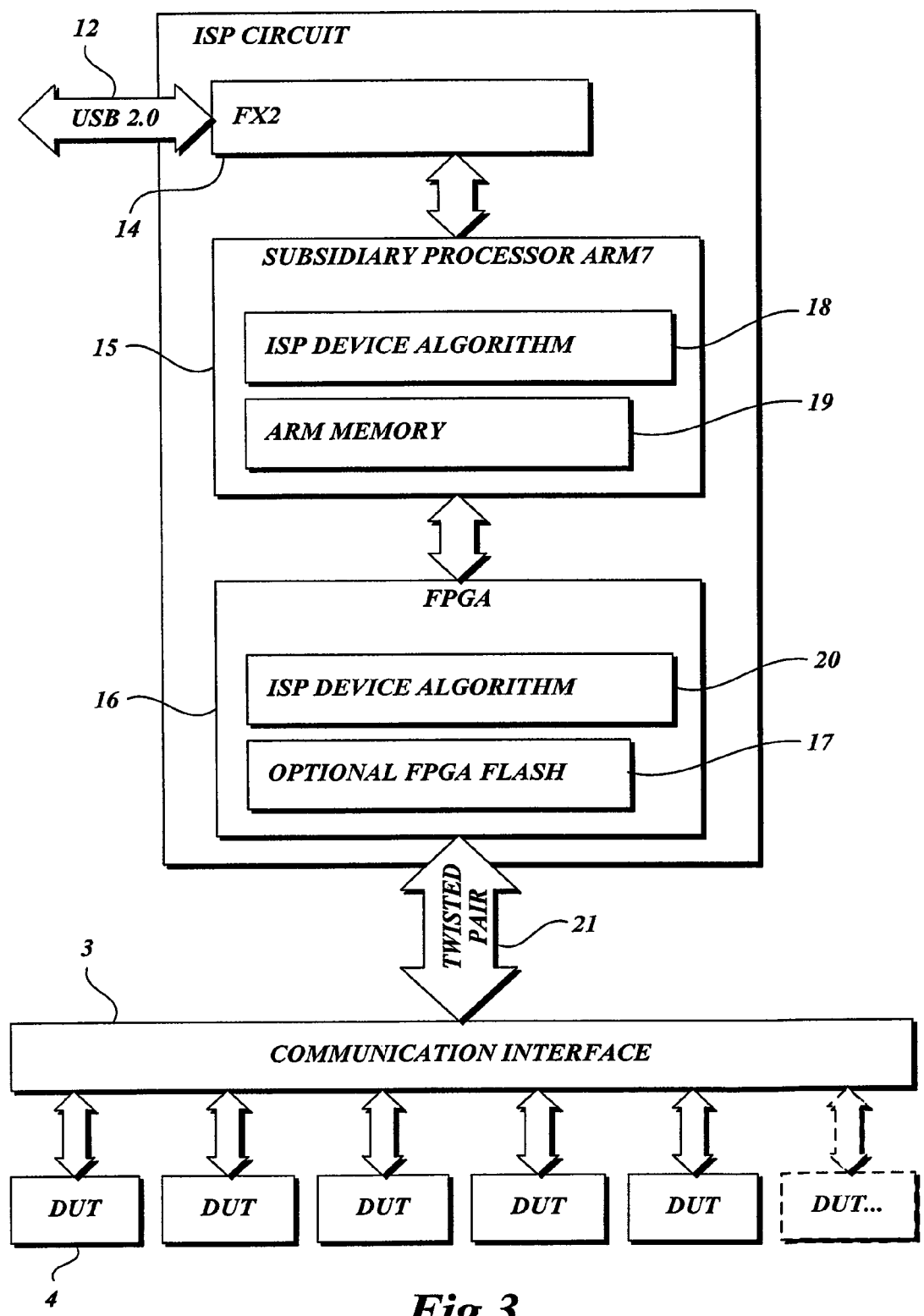
FIG. 3 is a block diagram of an in-system programming circuit and a communication interface, configured in accordance with an embodiment of the present invention.
Figure 4:
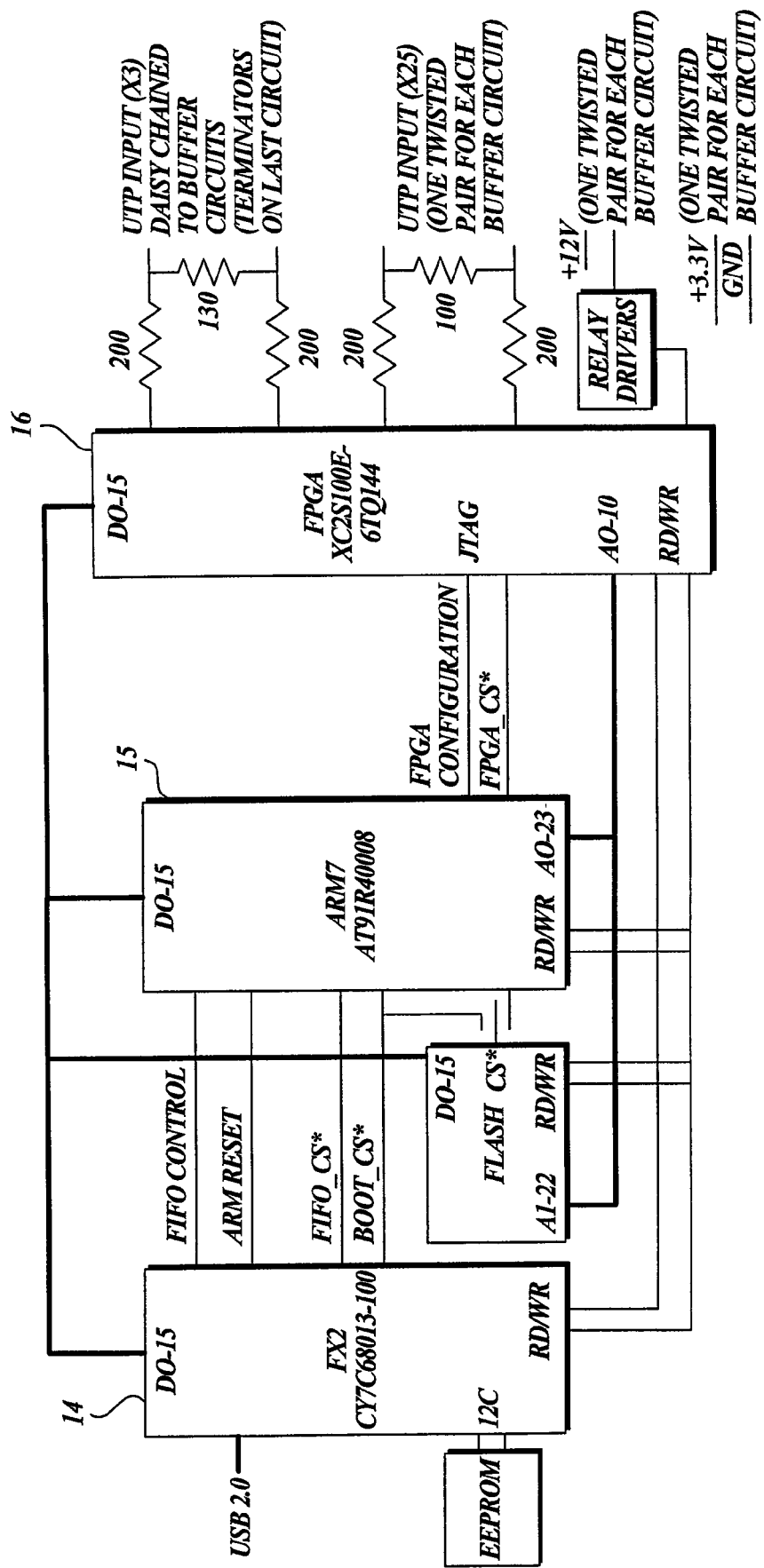
FIG. 4 is a block diagram of a detail view of a in-system programming circuit, configured in accordance with an embodiment of the present invention.

One form may be filled out for each device to be programmed and tested. The "Device Type" information 501 is used by the System PC to load the appropriate device algorithm 18 (FIG. 3) and bus algorithm 20 files into the ISP circuit 2 for the type of device being programmed. In particular, the files are uploaded to memory 19, such as an Advanced RISC Microprocessor ("ARM") memory, in ISP circuit 2 by the system ISP DLL 11 at run time. Based on information received through the application visual environment, the application development software 10 selects the algorithm files appropriate for the selected device type from libraries of device algorithms 6 (FIG. 2) and bus algorithms 5 (FIG. 2).

Embodiments of the present invention are designed such that information for multiple different devices may be provided and those devices programmed concurrently. For example, multiple devices of the same type in communication with any number of buffer circuits may be concurrently programmed. Alternatively, multiple different devices on multiple different boards may be programmed concurrently. In one embodiment of the present invention, up to 24 boards may be programmed concurrently. However, it will be appreciated that this is not the limit of boards that may be programmed with embodiments of the present invention. In particular, by increasing the size of the FPGA 16 (FIG. 2) and adding I/O pins, an unlimited number of boards may be programmed and optionally verified concurrently.

Providing information into the application visual environment (FIG. 5A) also results in the creation of a custom configuration file 13 (FIG. 2). The file may be a text-based INI file that is read by the custom ISP application 8 at run time.

Once the information has been provided via the application visual environment and the custom configuration file 13 created, an API may be used to build a Custom ISP Application 8. This is an optional step, as a default ISP application may also be used.

The custom ISP application 8 may be developed in the C/C++ programming language based on a minimum skeleton program (not shown) and using the functions defined in the API to perform ISP operations. The API may include functions for, among other things (1) initializing the system hardware; (2) loading the custom data file(s) into memory; (3) loading a device algorithm specified by the custom configuration file 13 into the system hardware (ARM7); (4) loading the bus algorithm specified by the configuration file 13 into the system hardware (FPGA); (5) loading the device configuration parameters specified in the custom configuration file into the system hardware (ARM7) to be used by the ISP device algorithm 6; and (6) performing program, erase, check, program dynamic data (e.g., serial numbers), and verifying ISP operations on the Device Under Test ("DUT"). The API may also include other functions as well. In general, the API is designed to provide options (steps) based on a user's needs. The number and arrangement of options is limitless and each individual user can design or have designed an API that meets his or her individual needs.

The API links with the system Driver (DLL), which is able to communicate with the system hardware via an interface, such as a USB 2.0. The system DLL implements all of the details required for processing user data and controlling the system hardware. The end result of the application development session is the custom ISP application 8, plus a custom configuration File 13, which references library files 5 and 6 (FIG. 1) that contain the chosen device algorithm 18 and bus algorithm 20, and a user data file(s) 7. The custom ISP application 8 utilizes the functions implemented in the system driver that control the system hardware.

Run-time ISP programming occurs when the custom ISP application 8 is executed by the run time application 9 that runs in the System PC 1. The first time the custom ISP application 8 runs, it initiates the hardware setup and follows it immediately by programming the ISP devices. If the hardware has already been set up when the custom ISP application 8 runs, the hardware setup stage may be omitted.

In the beginning of the hardware setup phase, files that pertain to that board type are retrieved by the System PC 1 from its mass storage. Ordinarily these files are retrieved at the beginning of a run of boards and need not be retrieved again for each board. The files are loaded into PC memory as custom ISP application 8 and user data 7. Note that the PC may have other tasks running as well (for example, an ATE task 9). If an embodiment of the invention is operating in conjunction with an MDA, the VisMDA software 9 launches custom ISP application 8 at an appropriate time and custom ISP application 8 processes the custom configuration file 13. Based on the contents of the custom configuration file 13, the custom ISP application (by calling the appropriate functions in system API) loads the appropriate device and bus Algorithms 18 and 20, loads the appropriate user 7, and then executes the appropriate ISP programming steps.

Returning to FIG. 3, the ISP circuit 2 uses an interface chip 14, such as a Cypress USB 2.0 Interface Chip ("FX2"), to interface its end of the USB link 12. The ISP circuit may also contain a subsidiary processor 15, such as an ARM7 chip. The subsidiary processor 15 receives its operating software, the device algorithm 18, and the bus algorithm 20 from the interface 12, and stores them in Random Access Memory ("RAM"). The subsidiary processor 15 may also use JTAG to program the FPGA 16 with the bus algorithm 20. Optionally, FPGA 16 may be of a type served by a flash memory 17, in which case the subsidiary processor 15 may store the FPGA code in the flash memory. Because multiple different types of devices may be programmed, the FPGA may include multiple algorithms for interfacing with different types of devices and/or multiple different types of communication interfaces.

The data to be stored in the various ISP chips at runtime is transferred to the ISP circuit 2 from the System PC 1 over the interface 12 during runtime ISP programming, but the basic structures only need be set up once for a series of programming operations. As mentioned above, the ISP circuit 2 may be integrated with the System PC 1.

A separate board (or set of boards) containing communication interface 3 communicates to the individual ISP chips, each of which is labeled DUT 4 in the drawings. The link 21 from the ISP circuit 2 to the buffer circuit(s) 3 may be, for example, a twisted pair. The buffer circuits may be implemented on one or more buffer boards. If the application requires more than one buffer board, the link 21 is daisy-chained from each buffer board to the next. Additionally, in an alternative embodiment, the buffer circuit(s) 3 may be integrated onto the same board as the ISP circuit 2.

The buffer circuits are located immediately adjacent to the DUTs, providing short wires so as to avoid problems with parasitic lead inductance, capacitance, and transmission line effects. In one embodiment, the wires are kept short enough so that the propagation time of a signal on the wires is less than one-half of the edge transition times of the signals being propagated. For example, a signal having a one-nanosecond rise time may be carried in a wire short enough to carry the signal in one-half of a nanosecond. The length of the wire would depend on its characteristic impedance, but would generally be in the neighborhood of five inches. A terminator may be located on the last buffer circuit 3 to prevent signal reflections.

During the ISP Programming phase, subsidiary processor 15 provides data for programming each DUT 4 to FPGA 16 as requested by bus algorithm 18. FPGA 16, using bus algorithm 20, engages in the bus protocol for each of several DUTs 4, and is the direct cause of writing each data element into each DUT 4.

It is advantageous to divide the work of programming the DUT in these three processing levels. At the first processing level is a host computer 1 programmed to load digital information into a subsidiary processor 15 which may be accomplished by the host computer 1 generating serial bus data streams for communicating with the subsidiary processing circuit (ISP circuit) 2. At the second processing level is a subsidiary processor 15 of the ISP circuit 2 programmed to execute a device algorithm 18. As described above, the device algorithm 18 is selected from a library of device algorithms and is specific to the type of device to be programmed. The device algorithm, as described, includes the sequence of steps to be performed, such as erase, program, and verify, for the DUTs. At the third processing level is an FPGA 16 programmed to execute a bus algorithm which generates the appropriate bus protocol for the ISP device being programmed. Consider the data elements to be programmed into DUTs 4 as being queued and being programmed one element (a byte or a word, for example) at a time.

The bus algorithm 20 in the FPGA 16 handles communication to the ISP device(s) 4 at full hardware speed. Without the FPGA 16, the bus algorithm might be implemented as a processor subsystem or as a collection of hard-wired logic engines. If the bus algorithm were implemented as a processor subsystem, each operation in the bus algorithm would have to be performed by the execution of an instruction or sequence of instructions in a processor running a program of instructions and may not be carried out as rapidly. If the bus algorithm were implemented as a hardware engine, the flexibility needed for a universal programming appliance would be absent.

The subsidiary processor 15 executes the device algorithm 18, which provides the data element to be written and monitors the bus algorithm for completion of the previous cycle. Subsidiary processor 15 may also maintain a reserve of data to be programmed, making the next data element available to the bus algorithm 20 immediately upon completion of programming the previous one.

Without the subsidiary processor 15, the data queue would be maintained by the System PC 1 which would bring about a delay in requesting and receiving the data over the external bus 12 connecting the System PC and the ISP circuit. In addition, the System PC 1 may be busy with other tasks during ISP programming and might not be able to support the needs of the device algorithm in a timely manner.

In addition to providing the ability to program devices at full hardware speed, embodiments of the present invention provide the ability to verify the devices as they are programmed. Typical techniques for verifying devices require that the results be obtained from each programmed device and be read back to a System PC individually. For DUTs with a large number of devices, this verification technique is time consuming and slows the production line to an unacceptable level. Embodiments of the present invention provide the ability to write results from all programmed devices back to the ISP circuit and compare all data with expected results concurrently. Thus, regardless of the number of devices being programmed, the total time consumed in verifying the programming is only equal to the total time it takes to verify the one individual device that takes the longest time to verify.

While the embodiments of the present invention have been illustrated and described, it will be appreciated that various changes can be made therein without departing from the spirit and scope of the invention.

The embodiments of the invention in which an exclusive property or privilege is claimed are defined as follows:

1. An apparatus for programming a plurality of electrically separable in-system programmable (ISP) devices, comprising:
   a processor configured to communicate with an application development system including a selector for selecting a type of ISP device from a library of ISP devices in order to receive a device algorithm that specifies a sequence of steps to be performed when programming a selected type of in-system programmable device, data to be programmed into each of the plurality of in-system programmable devices, and a selected bus algorithm to communicate with the type of in-system programmable device to be programmed;
   an FPGA circuit that is configurable by the processor to implement the selected bus algorithm received from the application development system; and
   a communication interface that is configured to allow the plurality of electrically separable in-system programmable devices to be connected to and disconnected from the FPGA;
   wherein the processor is configured to provide the data received from the application development system to be programmed into each in-system programmable device to the FPGA in accordance with the device algorithm and the FPGA is configured by the processor to transfer the data simultaneously to the plurality of in-system programmable devices in accordance with the selected bus algorithm,
   wherein the processor, FPGA and communication interface are included in combination with an automatic test equipment fixture and wherein the plurality of in-system programmable devices are mounted on circuit boards and are programmed while in the automatic test equipment fixture.

2. The apparatus of claim 1, wherein the processor has an associated memory that is configured to store the device algorithm and the selected bus algorithm.

3. The apparatus of claim 1, wherein the communication interface is coupled to the FPGA with twisted pairs of wires.

4. The apparatus of claim 3, wherein the FPGA is configured to receive data from each in-system programmable device to simultaneously determine if each device has been programmed correctly.

5. A method of programming a plurality of electrically separable in-system programmable (ISP) devices, comprising:
   connecting the plurality of electrically separable in-system programmable devices to be programmed to an apparatus for programming the plurality of in-system programmable devices, of the type that includes:
- a processor configured to receive a device algorithm from an application development system of the type that includes a selector for selecting a type of ISP device from a library of ISP devices, wherein the device algorithm specifies a sequence of steps to be performed when programming a type of in-system programmable device, data to be programmed in each of the plurality of in-system programmable devices, and a selected bus algorithm to communicate with the type of in-system programmable device to be programmed;
- an FPGA circuit that is configurable by the processor to implement the selected bus algorithm; and
- a communication interface that allows the plurality of electrically separable in-system programmable devices to be connected to and disconnected from the FPGA;
- an automatic test equipment fixture;
- programming the processor with the selected device algorithm and configuring the FPGA with the selected bus algorithm received from the application development system; and
- simultaneously transmitting the data to be programmed into each of the plurality of in-system programmable devices from the FPGA to each of the in-system programmable devices in accordance with the selected bus algorithm
- wherein the processor, FPGA and communication interface are included in combination with the automatic test equipment fixture and wherein the plurality of in-system programmable devices are mounted on circuit boards and are programmed while in the automatic test equipment fixture.

6. An apparatus for programming a plurality of electrically separable in-system programmable (ISP) devices, comprising:
- a processor configured to communicate with an application development system including a selector for selecting a type of ISP device from a library of ISP devices in order to receive a device algorithm that specifies a sequence of steps to be performed when programming a type of in-system programmable device, data to be programmed into each of the plurality of in-system programmable devices, and a selected bus algorithm to communicate with the type of in-system programmable device to be programmed,
- a programmable logic circuit that is configurable by the processor to implement the selected bus algorithm received from the application development system; and
- a communication interface that allows the plurality of electrically separable in-system programmable devices to be connected to and disconnected from the programmable logic circuit;
  - wherein the processor is configured to provide the data received from the application development system to program each in-system programmable device to the programmable logic circuit in accordance with the device algorithm and the programmable logic circuit is configured to transfer the data simultaneously to the plurality of in-system programmable devices in accordance with the selected bus algorithm
  - wherein the processor, programmable logic circuit and communication interface are included in combination with an automatic test equipment fixture and wherein the plurality of in-system programmable devices are mounted on circuit boards and are programmed while in the automatic test equipment fixture.

7. The apparatus of claim 6, wherein the processor has an associated memory that is configured to store the device algorithm and the selected bus algorithm.

8. The apparatus of claim 6, wherein the programmable logic circuit is connected to the communication interface with a number of twisted pairs of wires.

9. The apparatus of claim 6, wherein the programmable logic circuit is configured to receive data from each in-system programmable device to simultaneously determine if the device has been programmed correctly.

* * * * *